United States Patent
Lee

(10) Patent No.: US 7,830,201 B2
(45) Date of Patent: Nov. 9, 2010

(54) INTERNAL VOLTAGE CONTROL DEVICE CAPABLE OF REDUCING CURRENT CONSUMPTION AND SEMICONDUCTOR MEMORY DEVICE USING THE SAME

(75) Inventor: Won Oh Lee, Suwon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 52 days.

(21) Appl. No.: 12/319,062

(22) Filed: Dec. 30, 2008

(65) Prior Publication Data

US 2010/0079199 A1 Apr. 1, 2010

(30) Foreign Application Priority Data

Sep. 30, 2008 (KR) .................... 10-2008-0096032

(51) Int. Cl.
*G05F 1/10* (2006.01)
(52) U.S. Cl. .................................... 327/540
(58) Field of Classification Search ............ 327/534, 327/535, 537, 540, 541
See application file for complete search history.

(56) References Cited

U.S. PATENT DOCUMENTS

| | | | |
|---|---|---|---|
| 6,201,378 B1 * | 3/2001 | Eto et al. ............... | 323/313 |
| 6,721,211 B2 * | 4/2004 | Lee et al. ............... | 365/189.09 |
| 6,781,443 B2 * | 8/2004 | Hamamoto et al. ........ | 327/541 |
| 6,937,088 B2 * | 8/2005 | Hamamoto et al. ........ | 327/541 |
| 7,420,407 B2 | 9/2008 | Kim | |
| 7,456,680 B2 | 11/2008 | Gyohten et al. | |

FOREIGN PATENT DOCUMENTS

KR 10-2006-0027058 3/2006
KR 10-2007-0010301 A 1/2007

\* cited by examiner

*Primary Examiner*—Jeffrey S Zweizig
(74) *Attorney, Agent, or Firm*—John P. White; Cooper & Dunham LLP

(57) ABSTRACT

An internal voltage control apparatus capable of reducing current consumption and a semiconductor memory device using the same includes an enable signal generating unit for generating an enable signal in response to an active signal and an internal voltage driving unit driven by the active signal and the enable signal, wherein the internal voltage driving unit drives an internal voltage by comparing the internal voltage and a reference voltage and then generating first and second driving signals, and wherein the enable signal generating unit receives the second driving signal and then determines enablement of the enable signal.

40 Claims, 8 Drawing Sheets

INTERNAL VOLTAGE CONTROL DEVICE CAPABLE OF REDUCING CURRENT CONSUMPTION AND SEMICONDUCTOR MEMORY DEVICE USING THE SAME

TECHNICAL FIELD

The present disclosure relates to a semiconductor memory device and, more particularly, to an internal voltage control apparatus of a semiconductor memory device.

BACKGROUND

Generally, a sense amplifier pull-up voltage is maintained for a predetermined time, when a word line is enabled in a semiconductor memory device. At this time, a supply voltage VDD, which is higher than an internal voltage VCORE, is used as the voltage level of the sense amplifier pull-up voltage in order to increase the sensing speed in amplifying a voltage difference between two bit lines BL and /BL, which share charge with each other before a data input/output operation.

This is called "over-driving" and the pull-up voltage of the sense amplifier is maintained at the internal voltage VCORE after the over-driving. In this processing, since the internal voltage VCORE is increased, an internal voltage control apparatus is required to return the increased internal voltage VCORE to the original internal voltage.

FIG. 1 is a block diagram illustrating a structure of a conventional internal voltage control apparatus, and FIG. 2 is a timing chart showing the operation of the internal voltage control apparatus in FIG. 1.

Referring to FIG. 1, the conventional internal voltage control apparatus includes a first driving signal generating unit 100 to generate a driving signal DRV_ONB for a boosted voltage of an internal voltage VCORE, a second driving signal generating unit 200 to generate a driving signal RELEASE_ON for a voltage drop of the internal voltage VCORE, and a driving unit 300 to drive the internal voltage VCORE in response to the driving signals DRV_ONB and RELEASE_ON.

This internal voltage generating unit drives the first driving signal generating unit 100 and the second driving signal generating unit 200, in accordance with the voltage level of the internal voltage VCORE when an active signal ACTIVE is enabled.

The first driving signal generating unit 100 performs the voltage boosting operation of the internal voltage VCORE when the internal voltage VCORE is lower than a reference voltage VREFC, and the second driving signal generating unit 200 performs the voltage drop operation of the internal voltage VCORE when the internal voltage VCORE is higher than a reference voltage VREFC.

Referring to FIG. 2, since the conventional internal voltage control apparatus is driven only by the internal voltage VCORE in a state where the active signal ACTIVE is enabled, unnecessary operation is carried out in an operation section to return the boosted voltage to the original internal voltage. Further, in the case where the response time of the first driving signal generating unit 100 is different from that of the second driving signal generating unit 200, there is a problem in that current consumption is increased because the first and second driving signal generating units 100 and 200 can operate simultaneously.

SUMMARY

In an aspect of this disclosure, an internal voltage control apparatus and a semiconductor memory device using the same are provided that are capable of preventing unnecessary current consumption from being caused by performing a voltage drop of a boosted internal voltage, which is generated by an over-driving operation, and thereafter by disabling the voltage drop of the internal voltage until the internal voltage is increased by the next over-driving.

In an embodiment, an internal voltage control apparatus includes an enable signal generating unit for generating an enable signal in response to an active signal, and an internal voltage driving unit driven by the active signal and the enable signal, wherein the internal voltage driving unit drives an internal voltage by comparing the internal voltage and a reference voltage and then generating first and second driving signals, and wherein the enable signal generating unit receives the second driving signal and then determines enablement of the enable signal.

In another embodiment, an internal voltage control apparatus includes a driving signal generating unit for generating first and second driving signals by comparing an internal voltage and a reference voltage, wherein the driving signal generating unit is driven by an active signal, a driving unit for driving the internal voltage in response to the first and second driving signals, and an enable signal generating unit for generating an enable signal in response to the active signal and the second driving signal, wherein the driving signal generating unit receives the enable signal and then controls generation of the second driving signal.

In another embodiment, an internal voltage control apparatus includes a first driving signal generating unit for generating a first driving signal by comparing an internal voltage and a reference voltage, wherein the first driving signal generating unit is driven by an active signal, a second driving signal generating unit for generating a second driving signal by comparing the internal voltage and the reference voltage, wherein the second driving signal generating unit is driven by an enable signal, an enable signal generating unit for generating the enable signal in response to the active signal and the second driving signal, and a driving unit for driving the internal voltage in response to the first and second driving signals.

In still another embodiment, an internal voltage control apparatus includes an internal voltage generating unit for generating an internal voltage, an internal voltage control unit for controlling the internal voltage by comparing the internal voltage and a reference voltage, wherein the internal voltage control unit is driven by an active signal and an enable signal, and a sense amplifier driven by the internal voltage in order to sense a voltage difference on bit lines.

BRIEF DESCRIPTION OF THE DRAWINGS

The above and other aspects, features and other advantages of the subject matter of this disclosure will be more clearly understood from the following detailed description taken in conjunction with the accompanying drawings, in which.

DETAILED DESCRIPTION OF PREFERRED EMBODIMENTS

Hereinafter, examples and embodiments of this disclosure will be described with reference to accompanying drawings. However, the examples and embodiments are for illustrative purposes only and are not intended to limit the scope of the invention.

Figure 1:
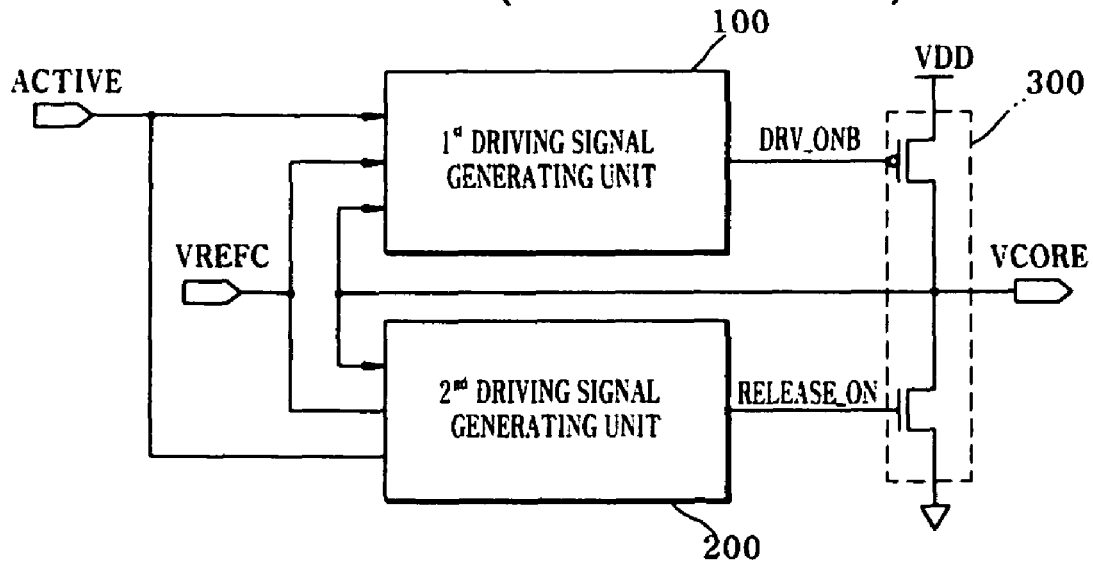
FIG. 1 is a block diagram illustrating a structure of a conventional internal voltage control apparatus.
Figure 2:
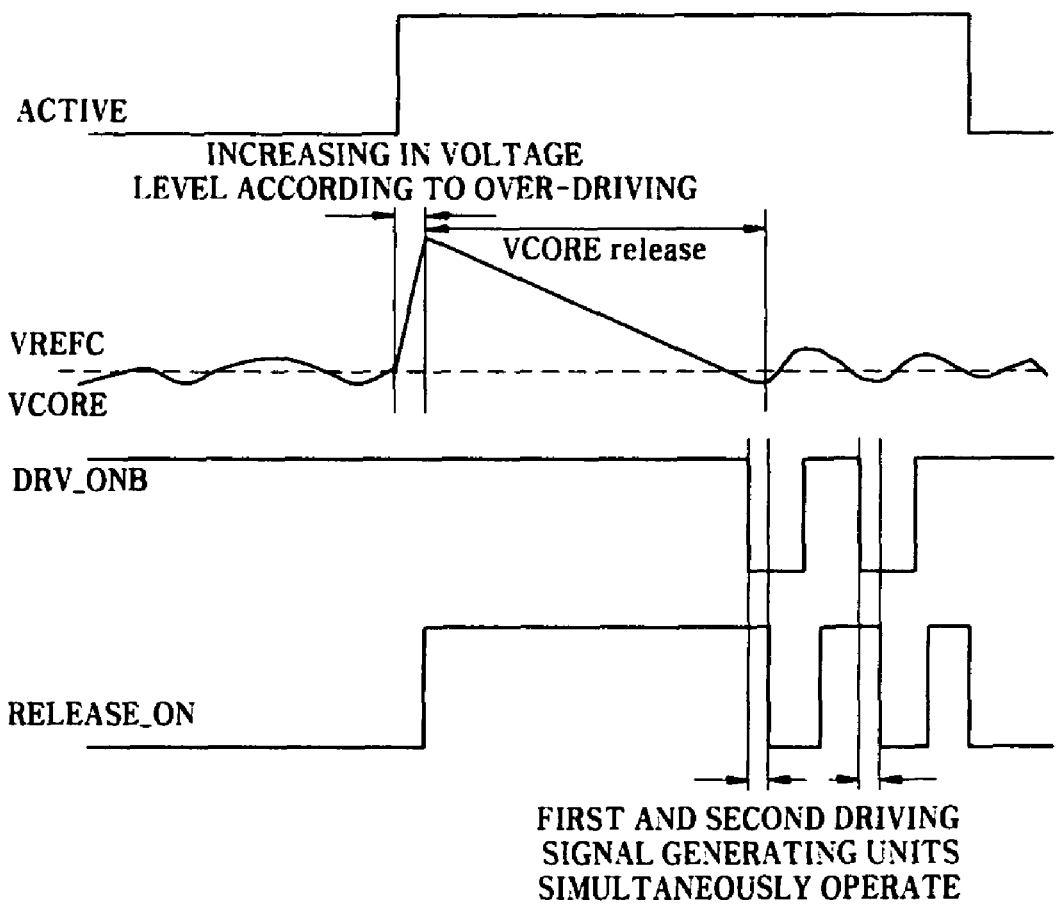
FIG. 2 is a timing chart showing the operation of the internal voltage control apparatus of FIG. 1.
Figure 3:
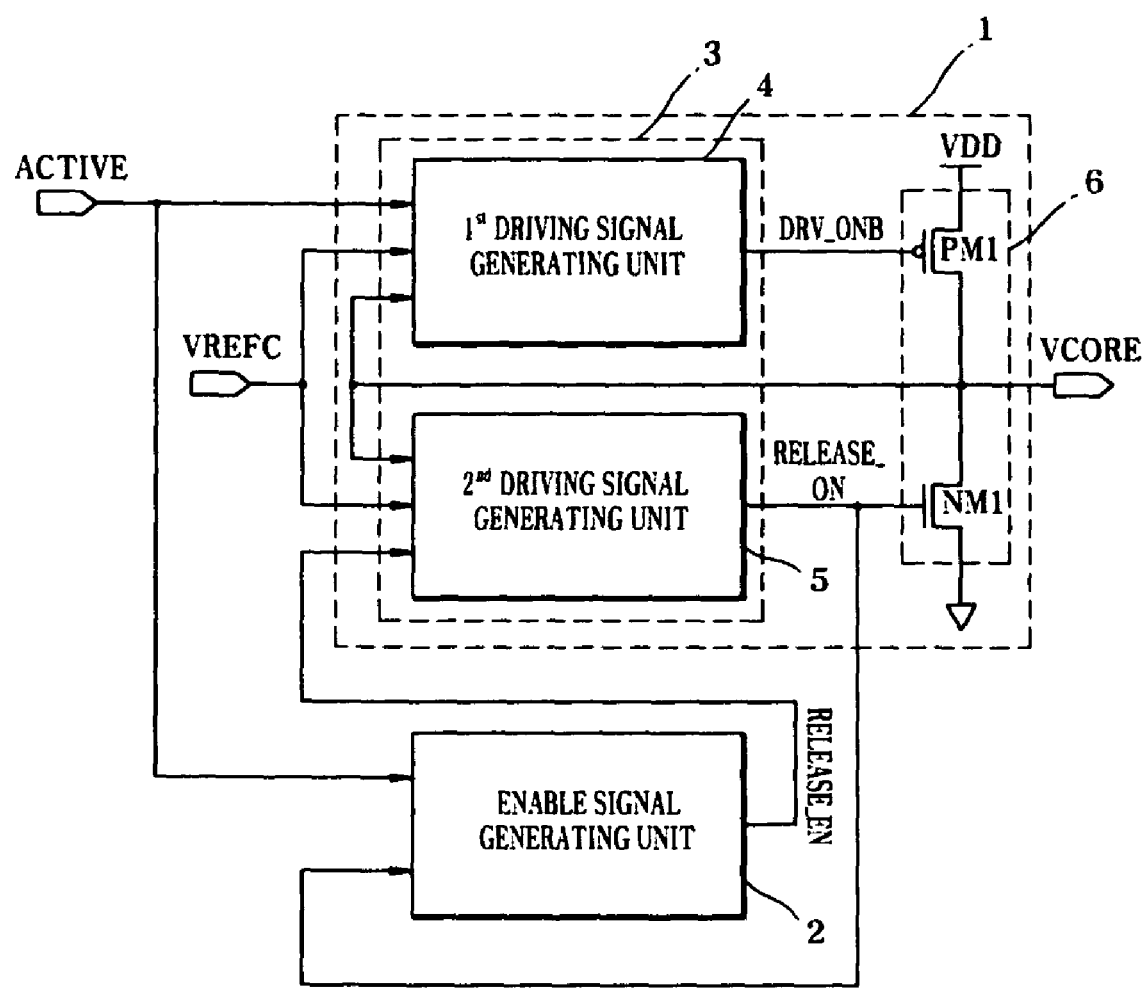
FIG. 3 is a block diagram illustrating an example of a structure of an internal voltage control apparatus in accordance with an embodiment of this disclosure.

FIG. 3 is a block diagram illustrating an example of a structure of an internal voltage control apparatus in accordance with an embodiment of this disclosure.

Referring to FIG. 3, the internal voltage control apparatus includes an internal voltage driving unit 1 and an enable signal generating unit 2.

The internal voltage driving unit 1 is driven by an active signal ACTIVE and an enable signal RELEASE_EN. The internal voltage driving unit 1 drives an internal voltage VCORE in accordance with first and second driving signals DRV_ONB and RELEASE_ON by comparing the internal voltage VCORE with a reference voltage VREFC.

The enable signal generating unit 2 generates an enable signal RELEASE_EN in response to the active signal ACTIVE and the second driving signal RELEASE_ON, and determines enablement of the enable signal RELEASE_EN in accordance with the second driving signal RELEASE_ON.

The internal voltage driving unit 1 includes a driving signal generating unit 3, which is driven by the active signal ACTIVE and generates the first and second driving signals DRV_ONB and RELEASE_ON by comparing the internal voltage VCORE with the reference voltage VREFC, and a driving unit 6 to drive the internal voltage VCORE in response to first and second driving signals DRV_ONB and RELEASE_ON.

The driving signal generating unit 3 includes a first driving signal generating unit 4 to generate the first driving signal DRV_ONB for a boosted voltage of the internal voltage VCORE, and a second driving signal generating unit 5 to generate the second driving signal RELEASE_ON for a voltage drop of the internal voltage VCORE.

The first driving signal generating unit 4 compares the internal voltage VCORE with the reference voltage VREFC, when the active signal ACTIVE is enabled, and generates the first driving signal DRV_ONB for a boosted voltage of the internal voltage VCORE based on the result of the comparison.

The second driving signal generating unit 5 compares the internal voltage VCORE with the reference voltage VREFC, when the enable signal RELEASE_EN is enabled, and generates the first driving signal DRV_ONB for a voltage drop of the internal voltage VCORE based on the result of the comparison.

The driving unit 6 includes a first pull-up driving unit PM1 to increase and drive the internal voltage VCORE in response to the first driving signal DRV_ONB, and a first pull-down driving unit NM1 to decrease and drive the internal voltage VCORE in response to the second driving signal RELEASE_ON.

Figure 4:
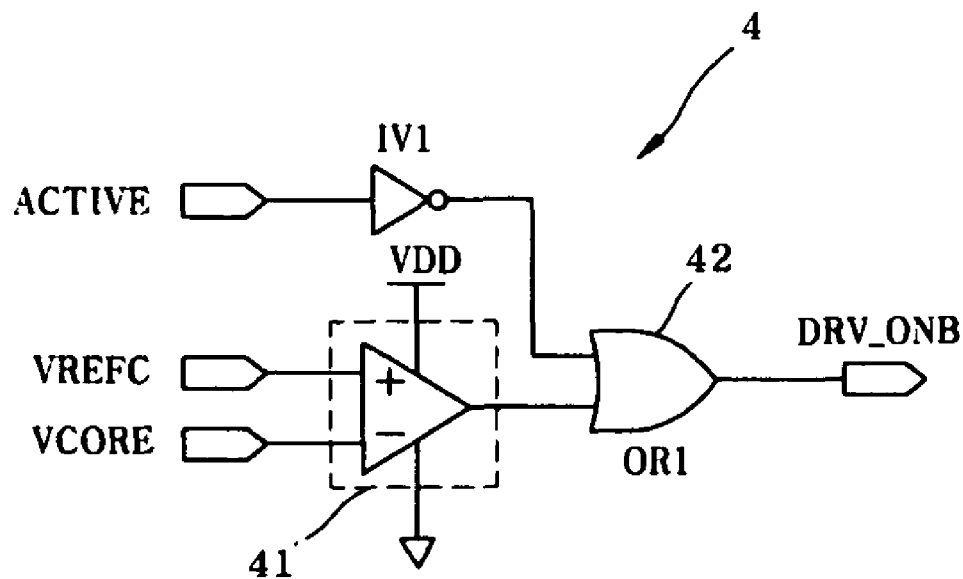
FIG. 4 is a circuit diagram illustrating an example of a structure of a first driving signal generating unit shown in FIG. 3.

FIG. 4 is a circuit diagram illustrating an example of a structure of the first driving signal generating unit 4 shown in FIG. 3.

Referring to FIG. 4, the first driving signal generating unit 4 includes a first comparison unit 41 to compare the internal voltage VCORE with the reference voltage VREFC, an inverting element IV1 to invert the active signal ACTIVE, and a first driving signal output unit 42 to generate the first driving signal DRV_ONB by logically combining output signals of the first comparison unit 41 and the inverting element IV1.

In a state where the active signal ACTIVE is enabled at a high level, the first driving signal generating unit 4 outputs the first driving signal DRV_ONB, which is enabled at a low level, when the internal voltage VCORE is lower than the reference voltage VREFC.

Figure 5:
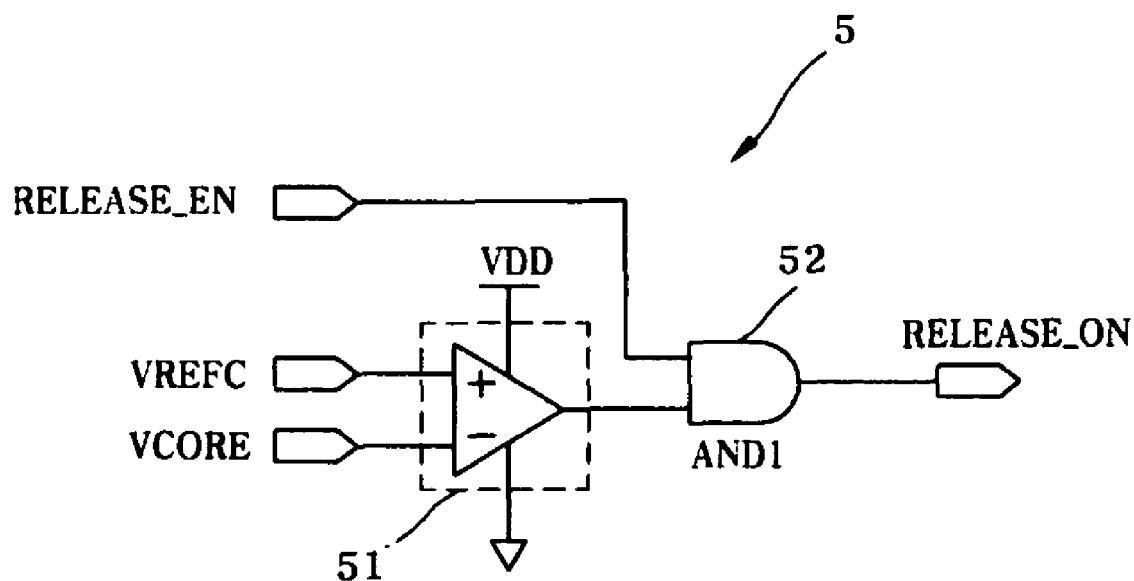
FIG. 5 is a circuit diagram illustrating an example of a structure of a second driving signal generating unit shown in FIG. 3.

FIG. 5 is a circuit diagram illustrating an example of a structure of the second driving signal generating unit 5 shown in FIG. 3.

Referring to FIG. 5, the second driving signal generating unit 5 includes a second comparison unit 51 to compare the internal voltage VCORE with the reference voltage VREFC, and a second driving signal output unit 52 to generate the second driving signal RELEASE_ON by logically combining an output signal of the second comparison unit 51 and the enable signal RELEASE_EN.

In a state where the enable signal RELEASE_EN is enabled at a high level, the second driving signal generating unit 5 outputs the second driving signal RELEASE_ON, which is enabled at a low level, when the internal voltage VCORE is higher than the reference voltage VREFC.

Figure 6:
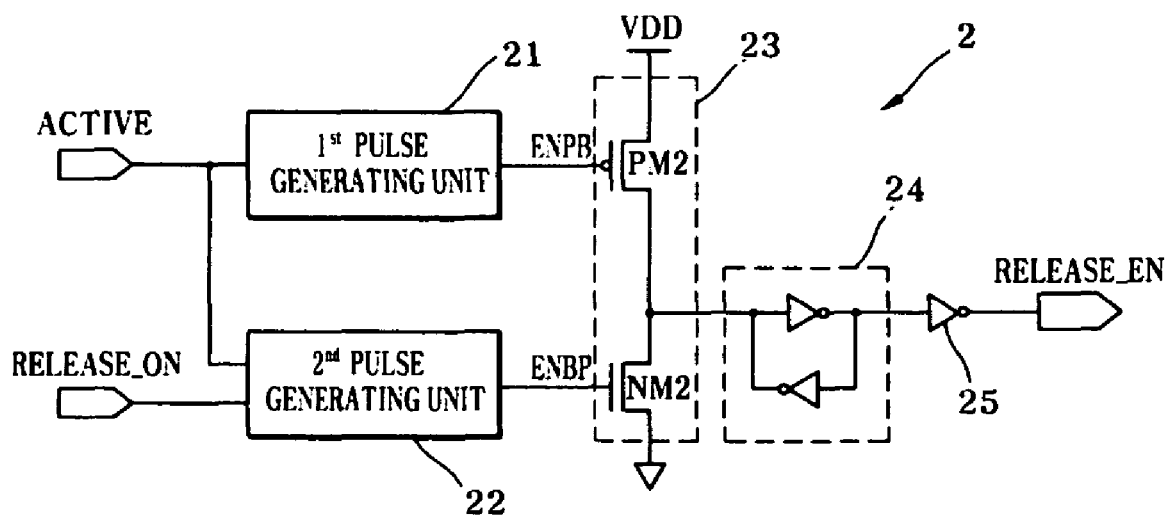
FIG. 6 is a circuit diagram illustrating an example of a structure of an enable signal generating unit shown in FIG. 3.

FIG. 6 is a circuit diagram illustrating an example of a structure of the enable signal generating unit 2 shown in FIG. 3.

Referring to FIG. 6, the enable signal generating unit 2 includes a first pulse generating unit 21 to generate a first pulse signal ENPB in response to the active signal ACTIVE, a second pulse generating unit 22 to generate a second pulse signal ENBP in response to the active signal ACTIVE and the second driving signal RELEASE_ON, and an enable signal driving unit 23 to drive the enable signal RELEASE_EN in response to the first and second pulse signals ENPB and ENBP.

The enable signal driving unit 23 includes a first pull-up driving element PM2 to perform a pull-up operation at a out node in response to the first pulse signal ENPB, and a first pull-down driving element NM2 to perform a pull-down operation at the out node in response to the second pulse signal ENBP.

The enable signal generating unit 2 further includes a latch unit 24 to latch an output signal of the enable signal driving unit 23, and a buffer unit 25 to buffer an output signal of the latch unit 24.

Figure 7:
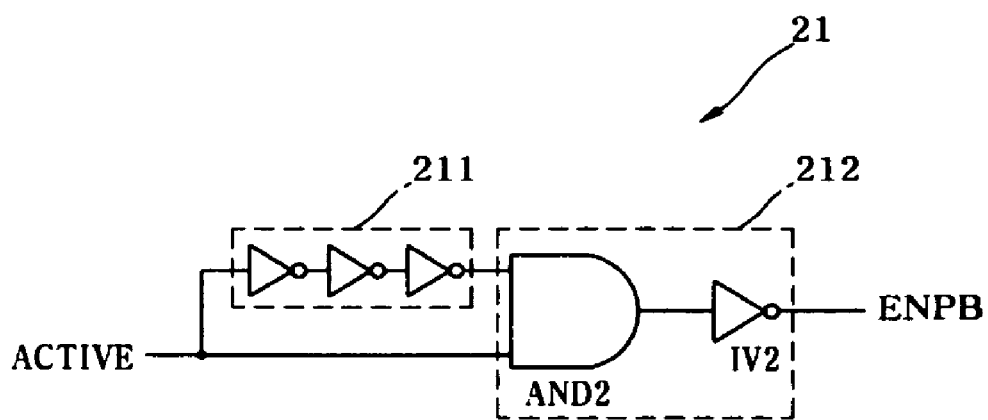
FIG. 7 is a circuit diagram illustrating an example of a structure of a first pulse generating unit shown in FIG. 6.

FIG. 7 is a circuit diagram illustrating an example of a structure of the first pulse generating unit 21 shown in FIG. 6

Referring to FIG. 7, the first pulse generating unit 21 includes a first delay unit 211, which has an odd number of inverters, to delay the active signal ACTIVE for a predetermined period of time, and a first pulse output unit 212 to output the first pulse signal ENPB by NANDing the active signal ACTIVE and an output signal of the first delay unit 211. This first pulse generating unit 21 generates the first pulse signal ENPB when the active signal ACTIVE is enabled from a low level to a high level.

Figure 8:
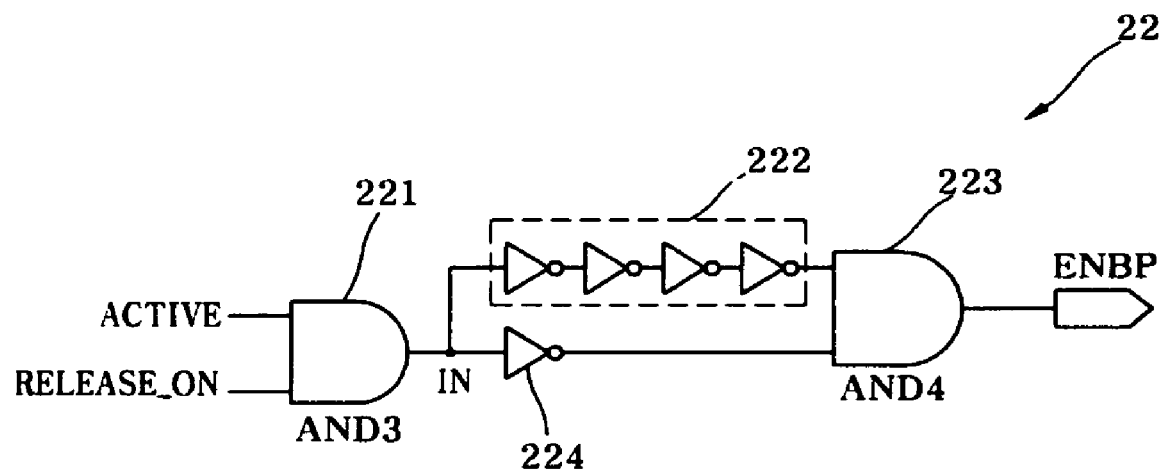
FIG. 8 is a circuit diagram illustrating an example of a structure of a second pulse generating unit shown in FIG. 6.

FIG. 8 is a circuit diagram illustrating an example of a structure of the second pulse generating unit 22 shown in FIG. 6.

Referring to FIG. 8, the second pulse generating unit 22 includes an signal input unit 221 for ANDing the active signal ACTIVE and the second driving signal RELEASE_ON, a second delay unit 222, which has an even number of inverters, to delay an output signal IN of the signal input unit 221 for a predetermined period of time, an inverter element 224 to invert the output signal of the signal input unit 221, and a second pulse signal output unit 223 to output the second pulse signal ENBP by ANDing an output signal of the second delay unit 222 and an output signal of the inverter element 224. This second pulse generating unit 22 generates the second pulse signal ENBP when the second driving signal RELEASE_ON is enabled from a high level to a low level.

Figure 9:
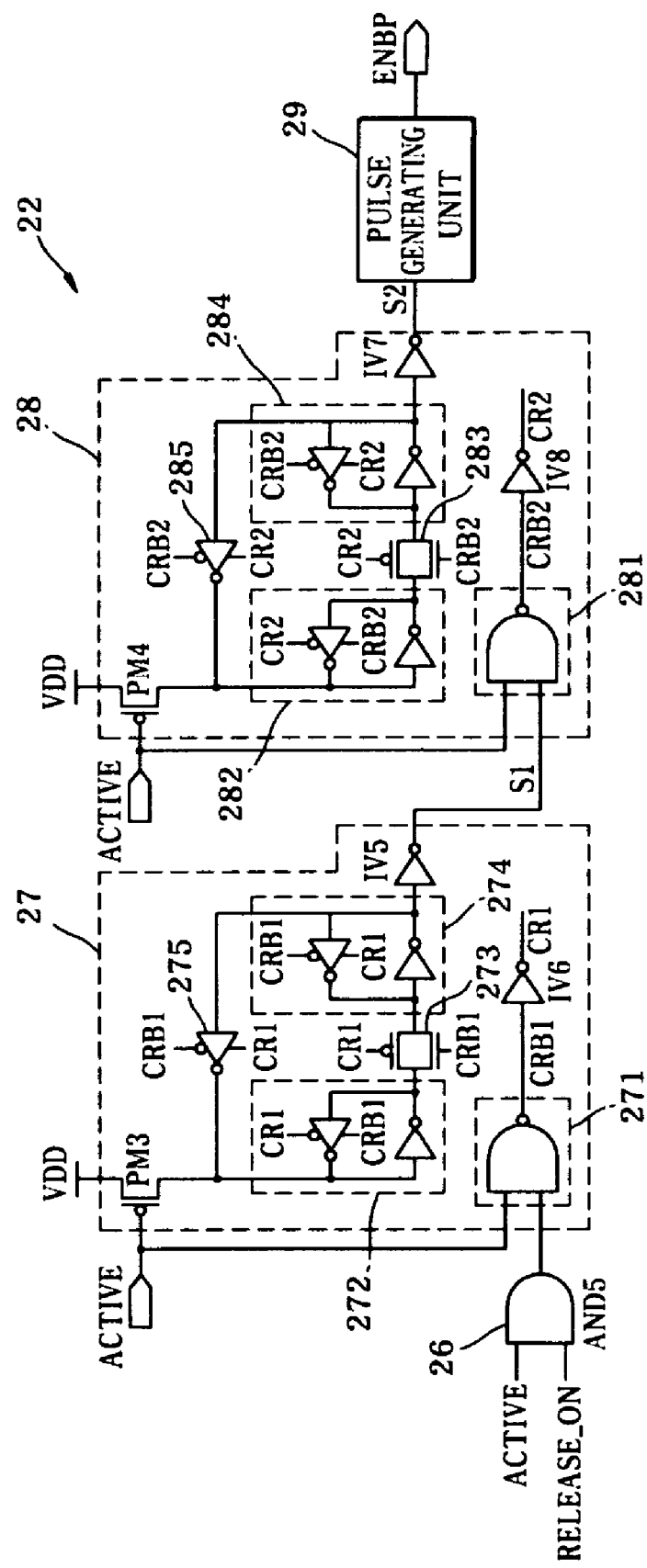
FIG. 9 is a circuit diagram illustrating another example of a structure of the second pulse generating unit shown in FIG. 6.

FIG. 9 is a circuit diagram illustrating another example of a structure of the second pulse generating unit 22 shown in FIG. 6.

Referring to FIG. 9, the second pulse generating unit 22 includes a signal input unit 26 for ANDing the active signal ACTIVE and the second driving signal RELEASE_ON, a first signal generating unit 27 to generate a first signal S1 in response to an output signal of the signal input unit 26 and the active signal ACTIVE, a second signal generating unit 28 to generate a second signal S2 in response to the active signal ACTIVE and the first signal 51, and a pulse generating unit 29 to generate the second pulse signal ENBP in response to the second signal S2.

The first signal generating unit 27 includes a first pull-up driving element PM3 to perform a pull-up driving operation in response to the active signal ACTIVE, a first control signal output unit 271 to generate a first control signal CRB1 by NANDing the active signal ACTIVE and an output signal of the signal input unit 26, a first latch unit 272 to latch an output signal of the first pull-up driving element PM3 in response to an output signal of the first control signal output unit 271, a first transfer unit 273 to transfer an output signal of the first latch unit 272 in response to the output signal of the first control signal output unit 271, a second latch unit 274 to latch an output signal of the first transfer unit 273 in response to the output signal of the first control signal output unit 271, and a second transfer unit 275 to invert an output signal of the second latch unit 274 and transfer the inverted signal to the first latch unit 272 in response to the output signal of the first control signal output unit 271.

The second signal generating unit 28 includes a second pull-up driving element PM4 to perform a pull-up driving operation in response to the active signal ACTIVE, a second control signal output unit 281 to generate a second control signal CRB2 by NANDing the active signal ACTIVE and an output signal S1 of the first signal generating unit 27, a third latch unit 282 to latch an output signal of the second pull-up driving element PM4 in response to the second control signal CRB2, a third transfer unit 283 to transfer an output signal of the third latch unit 282 in response to the second control signal CRB2, a fourth latch unit 284 to latch an output signal of the third transfer unit 283 in response to the second control signal CRB2, and a fourth transfer unit 285 to invert an output signal of the fourth latch unit 284 and transfer the inverted signal to the third latch unit 282 in response to the second control signal CRB2.

The pulse generator 29 has the same configuration as the first pulse generating unit shown in FIG. 6.

Referring again to FIG. 6, the second pulse generating unit 22 generates the second pulse signal ENBP, which has a predetermined section, and disables the enable signal RELEASE_EN when the N-th transition of the second driving signal RELEASE_ON, which goes from a high level to a low level, occurs. In this embodiment, the second pulse generating unit 22 generates the second pulse signal ENBP when the second driving signal RELEASE_ON goes from a high level to a low level.

In more detail, when the second driving signal RELEASE_ON goes from a high level to a low level, the signal input unit 26 outputs a low level signal and the first control signal output unit 271 outputs the first control signal CRB1 of a high level and the first control signal CR1 of a low level, in response to the active signal ACTIVE and the low level output signal from the signal input unit 26.

Accordingly, since the first transfer unit 273 is enabled in response to the first control signals CR1 and CRB1, the first signal S1 is output as a low level signal.

Next, the second control signal output unit 281 outputs the second control signal CRB2 of a high level and the second control signal CR2 of a low level, in response to the active signal ACTIVE and the first signal S1 of a low level.

The third transfer unit 283 is enabled in response to the second control signals CR2 and CRB2 and then the second signal S2 is output as a low level signal.

Meanwhile, when the second driving signal RELEASE_ON goes from a low level to a high level, the signal input unit 26 outputs a high level signal and the first control signal output unit 271 outputs the first control signal CRB1 of a low level and the first control signal CR1 of a high level in response to the active signal ACTIVE and the high level output signal from the signal input unit 26.

Therefore, since the second transfer unit 275 is enabled in response to the first control signal CRB1 of a low level and the first control signal CR1 of a high level and outputs a low level signal, the first latch unit 272 outputs a high level signal. At this time, since the first transfer unit 273 is disabled in response to the first control signals CR1 and CRB1, the first signal S1 is maintained at a low level and the second signal S2 is also maintained at a low level.

When the second driving signal RELEASE_ON goes again from a high level to a low level, the signal input unit 26 outputs a low level signal and the first control signal output unit 271 outputs the first control signal CRB1 of a high level and the first control signal CR1 of a low level, in response to the active signal ACTIVE and the low level output signal from the signal input unit 26.

Therefore, since the first transfer unit 273 is enabled in response to the first control signal CRB1 of a high level and the first control signal CR1 of a low level, a high level signal of the first latch unit 272 is transferred. As a result, the first signal S1, which is transited to a high level signal, is output.

Next, the second control signal output unit 281 outputs the second control signal CRB2 of a low level and the second control signal CR2 of a high level in response to the active signal ACTIVE and the first signal S1 of a high level.

Accordingly, since the third transfer unit 283 is disabled in response to the second control signals CR2 and CRB2 and the fourth transfer unit 285 is enabled, the output signal of the third latch unit 282 is changed into a high level signal; however, the second signal S2 is maintained at a low level.

As mentioned above, when the second driving signal RELEASE_ON is transited from a high level to a low level, the second signal S2 is transited from a low level to a high level.

Therefore, the pulse generator 29 generates the second pulse signal ENBP in response to the second signal S2.

The second pulse generating unit 22 generates the second pulse signal ENBP, which has a predetermined section, and disables the enable signal RELEASE_EN at the time of the third transition of the second driving signal RELEASE_ON from a high level to a low level.

Figure 11:
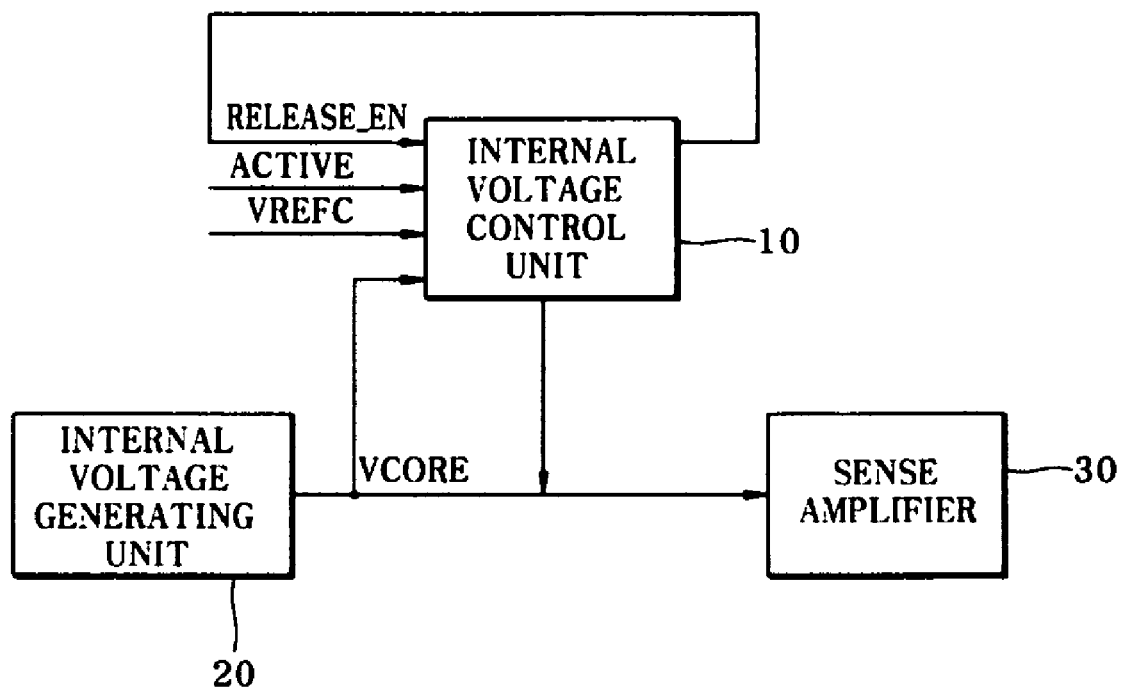
FIG. 11 is a block diagram illustrating an example of a structure of a semiconductor memory device in accordance with this disclosure.

FIG. 11 is a block diagram illustrating an example of a structure of a semiconductor memory device in accordance with this disclosure.

Referring to FIG. 11, the semiconductor memory device includes an internal voltage generating unit 7 to generate the internal voltage VCORE, an internal voltage control unit 6 to control the internal voltage VCORE, and a sense amplifier 8 driven by the internal voltage VCORE.

The internal voltage control unit 6, which is driven by the active signal ACTIVE and the enable signal RELEASE_EN, controls the internal voltage VCORE by comparing the internal voltage VCORE with the reference voltage VREFC. This internal voltage control unit 6 performs an over-driving operation, which drives the internal voltage VCORE to the external supply voltage VDD, when the active signal ACTIVE is enabled at a high level, and performs an operation in which the internal voltage VCORE boosted by the over-driving operation drops.

The sense amplifier 8 is driven by the internal voltage VCORE, which is controlled by the internal voltage control unit 6, and then senses a voltage difference between bit lines.

The internal voltage control unit 6 includes an internal voltage driving unit 1 and an enable signal generating unit 2.

Referring to FIG. 3, the internal voltage driving unit 1 is driven by the active signal ACTIVE and the enable signal RELEASE_EN and drives the internal voltage VCORE in accordance with the first and second driving signals DRV_ONB and RELEASE_ON by comparing the internal voltage VCORE with the reference voltage VREFC.

The enable signal generating unit 2 generates the enable signal RELEASE_EN in response to the active signal ACTIVE and the second driving signal RELEASE_ON and determines enablement of the enable signal RELEASE_EN in accordance with the second driving signal RELEASE_ON.

Figure 10:
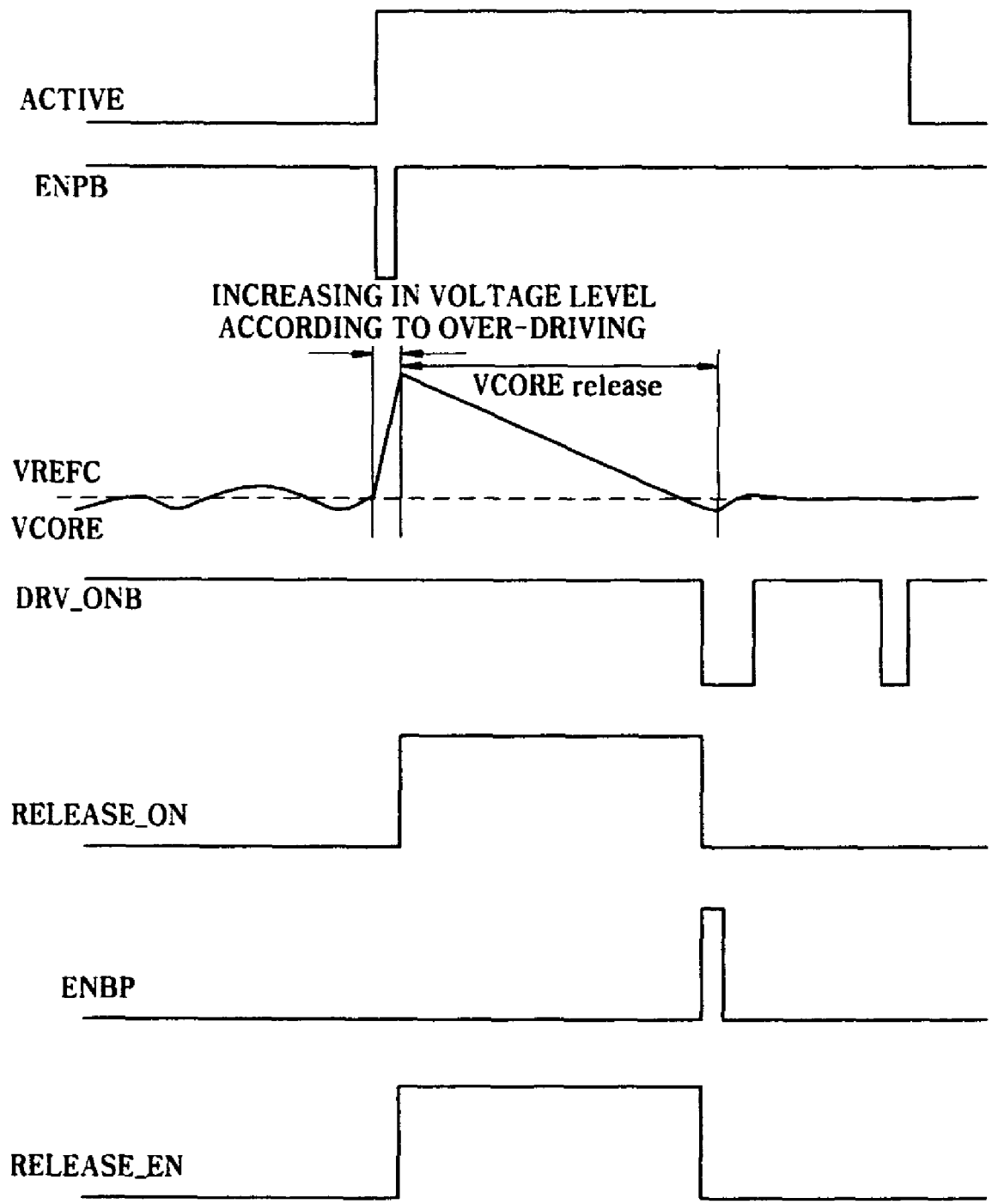
FIG. 10 is a timing chart showing timing of operation of the internal voltage control apparatus of FIG. 3.

Operation of the semiconductor memory device in accordance with this disclosure will be described in detail below. FIG. 10 is a timing chart showing timing of operation of the internal voltage control apparatus of FIG. 3.

When the word line is activated, the semiconductor memory device performs over-driving operation, in which the sense amplifier maintains, for a predetermined time, the pull-up voltage of the external supply voltage VDD which is higher than the internal voltage VCORE, in order to improve the sensing speed of a voltage difference which is generated between two bit lines which has the same voltage level through a charge sharing.

In this embodiment, referring to FIGS. 3 to 9, in the case where the internal voltage VCORE is increased more than the reference voltage VREFC due to the over-driving operation, two step controls can be carried out.

First, when the internal voltage VCORE is increased more than the reference voltage VREFC due to the over-driving operation, a voltage-drop control operation is carried out to decrease the internal voltage VCORE.

In more detail, the first driving signal generating unit 4 outputs the first driving signal DRV_ONB of a high level when the internal voltage VCORE which is boosted by the over-driving operation is higher than the reference voltage VREFC.

Therefore, the pull-up driving unit PM1 is disabled in response to the first driving signal DRV_ONB of the high level.

Enablement of the second driving signal generating unit 5 is determined based on the enable signal RELEASE_EN generated by the enable signal generating unit 2.

Referring to FIGS. 6 and 7, the enable signal generating unit 2 outputs the first pulse signal ENPB of a low level through the first pulse generating unit 21 when the active signal ACTIVE is enabled from a low level to a high level.

In more detail, the first delay unit 211 inverts the active signal ACTIVE, which is transited from a low level to a high level, and outputs the inverted signal. The first pulse signal output unit 212 outputs the first pulse signal ENPB of a low level which has a pulse width corresponding to the delay time of the first delay unit 211 by NANDing an output signal of the first delay unit 211 and the active signal ACTIVE.

As a result, the enable signal generating unit 2 outputs the enable signal RELEASE_EN, which is enabled at a high level, when the active signal ACTIVE is enabled from a low level to a high level.

The second driving signal generating unit 5 is enabled by the enable signal RELEASE_EN of a high level and outputs the second driving signal RELEASE_ON of a high level because the internal voltage VCORE is higher than the reference voltage VREFC due to the over-driving operation.

Therefore, the internal voltage driving unit 1 pull-down drives the internal voltage VCORE in response to the second driving signal RELEASE_ON of the high level.

Next, the internal voltage control operation, after the voltage drop of the boosted internal voltage, will be described in detail below.

The first driving signal generating unit 4 outputs the first driving signal DRV_ONB, which is enabled at a low level, when the internal voltage VCORE is lower than the reference voltage VREFC.

Therefore, the first pull-up driving unit PM1 pull-up drives the internal voltage in response to the first driving signal DRV_ONB of the low level.

The second driving signal generating unit 5 outputs the second driving signal RELEASE_ON at a low level, when the internal voltage VCORE is lower than the reference voltage VREFC.

Therefore, the first pull-down driving unit NM1 is disabled in response to the second driving signal RELEASE_ON of a low level.

Referring to FIGS. 6 and 8, the enable signal generating unit 2 generates the second pulse signal ENBP of a high level through the second pulse generating unit 22 when the second driving signal RELEASE_ON is disabled from a high level to a low level.

In more detail, the first pulse generating unit 22 generates the second pulse signal ENBP of a high level, which has a pulse width corresponding to the delay time of the second delay unit 222, when the second driving signal RELEASE_ON is disabled from a high level to a low level.

As a result, since the second pulse signal ENBP is generated at a high level when the second driving signal RELEASE_ON is disabled from a high level to a low level, the enable signal generating unit 2 disables the enable signal RELEASE_EN.

Since the second driving signal generating unit 5 is disabled by the enable signal RELEASE_EN of a low level, it is disabled in the case where the internal voltage VCORE is higher than the reference voltage VREFC.

As mentioned above, the internal voltage control circuit of the semiconductor memory device in accordance with this disclosure can prevent unnecessary current consumption by performing the voltage drop of the boosted internal voltage VCORE, which is caused by the over-driving operation, through the second driving signal generating unit 5, and thereafter by disabling the second driving signal generating unit 5 until the internal voltage is increased by the next over-driving.

Although examples and embodiments of the present invention have been described for illustrative purposes, those skilled in the art will appreciate that various modifications, additions and substitutions are possible, without departing from the scope and spirit of this disclosure and the accompanying claims.

This disclosure claims priority to Korean application 10-2008-0096032, filed on Sep. 30, 2008, the entire contents of which are incorporated herein by reference.

What is claimed is:

1. An internal voltage control apparatus comprising:
   an enable signal generating unit for generating an enable signal in response to an active signal; and
   an internal voltage driving unit driven by the active signal and the enable signal, wherein the internal voltage driving unit drives an internal voltage by comparing the internal voltage and a reference voltage and then generating first and second driving signals, and wherein the enable signal generating unit receives the second driving signal and then determines enablement of the enable signal in accordance with the second driving signal.

2. The internal voltage control apparatus of claim 1, wherein the first driving signal is used to increase a voltage level of the internal voltage and is enabled to a constant logic level when the internal voltage is lower than the reference voltage.

3. The internal voltage control apparatus of claim 1, wherein the second driving signal is used to decrease a voltage level of the internal voltage and is enabled to a constant logic level when the internal voltage is higher than the reference voltage.

4. The internal voltage control apparatus of claim 1, wherein the internal voltage driving unit includes:
   a first driving signal generating unit for generating the first driving signal to increase a voltage level of the internal voltage based on a comparison result obtained by comparing the internal voltage with the reference voltage, wherein the first driving signal generating unit is driven in response to the active signal;
   a second driving signal generating unit for generating the second driving signal to decrease a voltage level of the internal voltage based on a comparison result obtained by comparing the internal voltage with the reference voltage, wherein the second driving signal generating unit is driven in response to the enable signal; and
   a driving unit for driving the internal voltage in response to the first and second driving signals.

5. The internal voltage control apparatus of claim 4, wherein the first driving signal generating unit includes:
   a first comparison unit for comparing the internal voltage with the reference voltage; and
   a first driving signal output unit for outputting the first driving signal by logically combining an output signal of the first comparison unit and the active signal.

6. The internal voltage control apparatus of claim 5, wherein the second driving signal generating unit includes:
   a second comparison unit for comparing the internal voltage with the reference voltage; and
   a second driving signal output unit for outputting the second driving signal by logically combining an output signal of the second comparison unit and the enable signal.

7. The internal voltage control apparatus of claim 4, wherein the driving unit includes:
   a pull-up driving unit for pull-up driving the internal voltage in response to the first driving signal; and
   a pull-down driving unit for pull-down driving the internal voltage in response to the second driving signal.

8. The internal voltage control apparatus of claim 1, wherein the enable signal generated by the enable signal generating unit is enabled, when the active signal is enabled, and is disabled, when the second driving signal is disabled.

9. The internal voltage control apparatus of claim 1, wherein the enable signal generating unit includes:
   a first pulse generating unit for generating a first pulse signal in response to the active signal;
   a second pulse generating unit for generating a second pulse signal in response to the active signal and the second driving signal; and
   an enable signal driving unit for driving the enable signal in response to the first and second pulse signals.

10. The internal voltage control apparatus of claim 9, wherein the enable signal generating unit further includes:
    a latch unit for latching an output signal of the enable signal driving unit; and
    a buffer unit for buffering an output signal of the latch unit.

11. The internal voltage control apparatus of claim 9, wherein the first pulse generating unit includes:
    a first delay unit for delaying the active signal for a predetermined time; and
    a first pulse signal output unit for outputting the first pulse signal, which has a pulse width corresponding to a delay time of the first delay unit, by logically combining an output signal of the first delay unit and the active signal.

12. The internal voltage control apparatus of claim 9, wherein the first pulse signal output unit generates the first pulse signal when the active signal is enabled.

13. The internal voltage control apparatus of claim 9, wherein the second pulse generating unit includes:
    a signal input unit for logically combining the active signal and the second driving signal;
    a second delay unit having an even number of inverters to delay an output signal of the signal input unit for a predetermined time;
    an inverter for inverting the output signal of the signal input unit; and
    a second pulse signal output unit for outputting the second pulse signal, which has a pulse width corresponding to a delay time of the second delay unit, by logically combining an output signal of the second delay unit and an output signal of the inverter.

14. The internal voltage control apparatus of claim 13, wherein the second pulse signal output unit outputs the second pulse signal when the second driving signal is disabled.

15. The internal voltage control apparatus of claim 9, wherein the second pulse generating unit includes:
    a signal input unit for logically combining the active signal and the second driving signal;
    a first signal generating unit for generating a first signal in response to the active signal and an output signal of the signal input unit;
    a second signal generating unit for generating a second signal in response to the active signal and the first signal; and a pulse generating unit for generating a second pulse signal in response to the second signal.

16. The internal voltage control apparatus of claim 15, wherein the first signal generating unit includes:
a first pull-up driving element for performing a pull-up driving operation in response to the active signal;
a first control signal output unit for outputting a first control signal by NANDing the active signal and the output signal of the signal input unit;
a first latch unit for latching an output signal of the first pull-up driving element in response to the first control signal;
a first transfer unit for transferring an output signal of the first latch unit in response to the first control signal;
a second latch unit for latching an output signal of the first transfer unit in response to the first control signal;
a first buffer unit for outputting the first signal by buffering an output signal of the second latch unit; and
a second transfer unit for inverting the output signal of the second latch unit and then transferring the inverted output signal to the first latch unit in response to the first control signal.

17. The internal voltage control apparatus of claim 16, wherein the second signal generating unit includes:
a second pull-up driving element for performing a pull-up driving operation in response to the active signal;
a second control signal output unit for outputting a second control signal by NANDing the active signal and the output signal of the signal input unit;
a third latch unit for latching an output signal of the second pull-up driving element in response to the second control signal;
a third transfer unit for transferring an output signal of the third latch unit in response to the first control signal;
a fourth latch unit for latching an output signal of the third transfer unit in response to the second control signal;
a second buffer unit for outputting the second signal by buffering an output signal of the fourth latch unit; and
a fourth transfer unit for inverting the output signal of the fourth latch unit and then transferring the inverted output signal to the third latch unit in response to the second control signal.

18. The internal voltage control apparatus of claim 9, wherein the enable signal driving unit includes:
a first pull-up driving element for performing a pull-up driving operation at a out node in response to the first pulse signal; and
a first pull-down driving element for performing a pull-down driving operation at the out node in response to the second pulse signal.

19. An internal voltage control apparatus comprising:
a driving signal generating unit for generating first and second driving signals by comparing an internal voltage and a reference voltage, wherein the driving signal generating unit is driven by an active signal;
a driving unit for driving the internal voltage in response to the first and second driving signals; and
an enable signal generating unit for generating an enable signal in response to the active signal and the second driving signal,
wherein the driving signal generating unit receives the enable signal and then controls generation of the second driving signal.

20. The internal voltage control apparatus of claim 19, wherein the first driving signal is enabled at a predetermined voltage level when the internal voltage is lower than the reference voltage.

21. The internal voltage control apparatus of claim 19, wherein the second driving signal is enabled at a predetermined voltage level when the internal voltage is higher than the reference voltage.

22. The internal voltage control apparatus of claim 19, wherein the driving signal generating unit includes:
a first driving signal generating unit for generating the first driving signal to increase a voltage level of the internal voltage based on a comparison result obtained by comparing the internal voltage with the reference voltage, wherein the first driving signal generating unit is driven in response to the active signal; and
a second driving signal generating unit for generating the second driving signal to decrease a voltage level of the internal voltage based on a comparison result obtained by comparing the internal voltage with the reference voltage, wherein the second signal generating unit is driven in response to the enable signal.

23. The internal voltage control apparatus of claim 22, wherein the first driving signal generating unit includes:
a first comparison unit for comparing the internal voltage with the reference voltage; and
a first driving signal output unit for outputting the first driving signal by logically combining an output signal of the first comparison unit and the active signal.

24. The internal voltage control apparatus of claim 23, wherein the second driving signal generating unit includes:
a second comparison unit for comparing the internal voltage with the reference voltage; and
a second driving signal output unit for outputting the second driving signal by logically combining an output signal of the second comparison unit and the enable signal.

25. The internal voltage control apparatus of claim 19, wherein the driving unit includes:
a pull-up driving unit for pull-up driving the internal voltage in response to the first driving signal; and
a pull-down driving unit for pull-down driving the internal voltage in response to the second driving signal.

26. The internal voltage control apparatus of claim 19, wherein the enable signal generated by the enable signal generating unit is enabled, when the active signal is enabled, and is disabled, when the second driving signal is disabled.

27. The internal voltage control apparatus of claim 19, wherein the enable signal generating unit includes:
a first pulse generating unit for generating a first pulse signal in response to the active signal;
a second pulse generating unit for generating a second pulse signal in response to the active signal and the second driving signal; and
an enable signal driving unit for outputting the enable signal by performing a pull-up or pull-down operation at a out node in response to the first and second pulse signals.

28. The internal voltage control apparatus of claim 27, wherein the enable signal generating unit further includes:
a latch unit for latching an output signal of the enable signal driving unit; and
a buffer unit for buffering an output signal of the latch unit.

29. The internal voltage control apparatus of claim 27, wherein the first pulse generating unit includes:
a first delay unit having an odd number of inverters which delay the active signal for a predetermined time; and
a first pulse signal output unit for outputting the first pulse signal, which has a pulse width corresponding to a delay time of the first delay unit, by NANDing an output signal of the first delay unit and the active signal.

30. The internal voltage control apparatus of claim 27, wherein the first pulse signal output unit generates the first pulse signal when the active signal is enabled.

31. The internal voltage control apparatus of claim 27, wherein the second pulse generating unit includes:
   a signal input unit for logically combining the active signal and the second driving signal;
   a second delay unit having an even number of inverters to delay an output signal of the signal input unit for a predetermined time;
   an inverter for inverting the output signal of the signal input unit; and
   a second pulse signal output unit for outputting the second pulse signal, which has a pulse width corresponding to a delay time of the second delay unit, by logically combining an output signal of the second delay unit and an output signal of the inverter.

32. The internal voltage control apparatus of claim 31, wherein the second pulse signal output unit outputs the second pulse signal when the second driving signal is disabled.

33. The internal voltage control apparatus of claim 29, wherein the second pulse generating unit includes:
   a signal input unit for logically combining the active signal and the second driving signal;
   a first signal generating unit for generating a first signal in response to the active signal and an output signal of the signal input unit;
   a second signal generating unit for generating a second signal in response to the active signal and the first signal; and
   a pulse generating unit for generating a second pulse signal in response to the second signal.

34. The internal voltage control apparatus of claim 33, wherein the first signal generating unit includes:
   a first pull-up driving element for performing a pull-up driving operation in response to the active signal;
   a first control signal output unit for outputting a first control signal by NANDing the active signal and the output signal of the signal input unit;
   a first latch unit for latching an output signal of the first pull-up driving element in response to the first control signal;
   a first transfer unit for transferring an output signal of the first latch unit in response to the first control signal;
   a second latch unit for latching an output signal of the first transfer unit in response to the first control signal;
   a first buffer unit for outputting the first signal by buffering an output signal of the second latch unit; and
   a second transfer unit for inverting the output signal of the second latch unit and then transferring the inverted output signal to the first latch unit in response to the first control signal.

35. The internal voltage control apparatus of claim 33, wherein the second signal generating unit includes:
   a second pull-up driving element for performing a pull-up driving operation in response to the active signal;
   a second control signal output unit for outputting a second control signal by NANDing the active signal and the output signal of the signal input unit;
   a third latch unit for latching an output signal of the second pull-up driving element in response to the second control signal;
   a third transfer unit for transferring an output signal of the third latch unit in response to the second control signal;
   a fourth latch unit for latching an output signal of the third transfer unit in response to the second control signal;
   a second buffer unit for outputting the second signal by buffering an output signal of the fourth latch unit; and
   a fourth transfer unit for inverting the output signal of the fourth latch unit and then transferring the inverted output signal to the third latch unit in response to the second control signal.

36. The internal voltage control apparatus of claim 27, wherein the enable signal driving unit includes:
   a first pull-up driving element for performing a pull-up driving operation at a out node in response to the first pulse signal; and
   a first pull-down driving element for performing a pull-down driving operation at the out node in response to the second pulse signal.

37. An internal voltage control apparatus comprising:
   a first driving signal generating unit for generating a first driving signal by comparing an internal voltage and a reference voltage, wherein the first driving signal generating unit is driven by an active signal;
   a second driving signal generating unit for generating a second driving signal by comparing the internal voltage and the reference voltage, wherein the second driving signal generating unit is driven by an enable signal;
   an enable signal generating unit for generating the enable signal in response to the active signal and the second driving signal; and
   a driving unit for driving the internal voltage in response to the first and second driving signals.

38. The internal voltage control apparatus of claim 37, wherein the first driving signal is enabled at a predetermined voltage level to increase the internal voltage when the internal voltage is lower than the reference voltage.

39. The internal voltage control apparatus of claim 37, wherein the second driving signal is enabled at a predetermined voltage level to decrease the internal voltage when the internal voltage is higher than the reference voltage.

40. The internal voltage control apparatus of claim 37, wherein the enable signal generated by the enable signal generating unit is enabled, when the active signal is enabled, and is disabled, when the second driving signal is disabled.

* * * * *